US010779387B2

(12) United States Patent
Tsai et al.

(10) Patent No.: US 10,779,387 B2
(45) Date of Patent: Sep. 15, 2020

(54) EXTREME ULTRAVIOLET PHOTOLITHOGRAPHY SYSTEM AND METHOD

(71) Applicant: TAIWAN SEMICONDUCTOR MANUFACTURING CO., LTD., Hsinchu (TW)

(72) Inventors: Ming-Hsun Tsai, Hsinchu (TW); Han-Lung Chang, Kaohsiung (TW); Yen-Hsun Chen, Hsinchu (TW); Shao-Hua Wang, Taoyuan (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/249,046

(22) Filed: Jan. 16, 2019

(65) Prior Publication Data
US 2020/0166848 A1 May 28, 2020

Related U.S. Application Data

(60) Provisional application No. 62/771,564, filed on Nov. 26, 2018.

(51) Int. Cl.
G03F 7/20 (2006.01)
H05G 2/00 (2006.01)

(52) U.S. Cl.
CPC ........... *H05G 2/00* (2013.01); *G03F 7/70033* (2013.01); *G03F 7/70191* (2013.01); *H05G 2/006* (2013.01)

(58) Field of Classification Search
CPC ...................................................... H05G 2/006
See application file for complete search history.

(56) References Cited

U.S. PATENT DOCUMENTS

| 2005/0115333 A1* | 6/2005 | Fujimoto | G01F 1/00 73/861 |
| 2006/0249698 A1* | 11/2006 | Endo | G03F 7/70916 250/504 R |
| 2014/0246607 A1* | 9/2014 | Bykanov | G03F 1/22 250/504 R |
| 2017/0131129 A1* | 5/2017 | Ahr | H05G 2/006 |

* cited by examiner

*Primary Examiner* — Michelle M Iacoletti
(74) *Attorney, Agent, or Firm* — McClure, Qualey & Rodack, LLP

(57) ABSTRACT

A method of operating an extreme ultraviolet (EUV) lithography system includes directing a metallic droplet along a shroud, wherein the shroud has a first opening adjacent a droplet generator and a second opening adjacent an excitation region; partially shielding the second opening of the shroud; and emitting a laser beam encountering the metallic droplet to generate an EUV light.

20 Claims, 13 Drawing Sheets

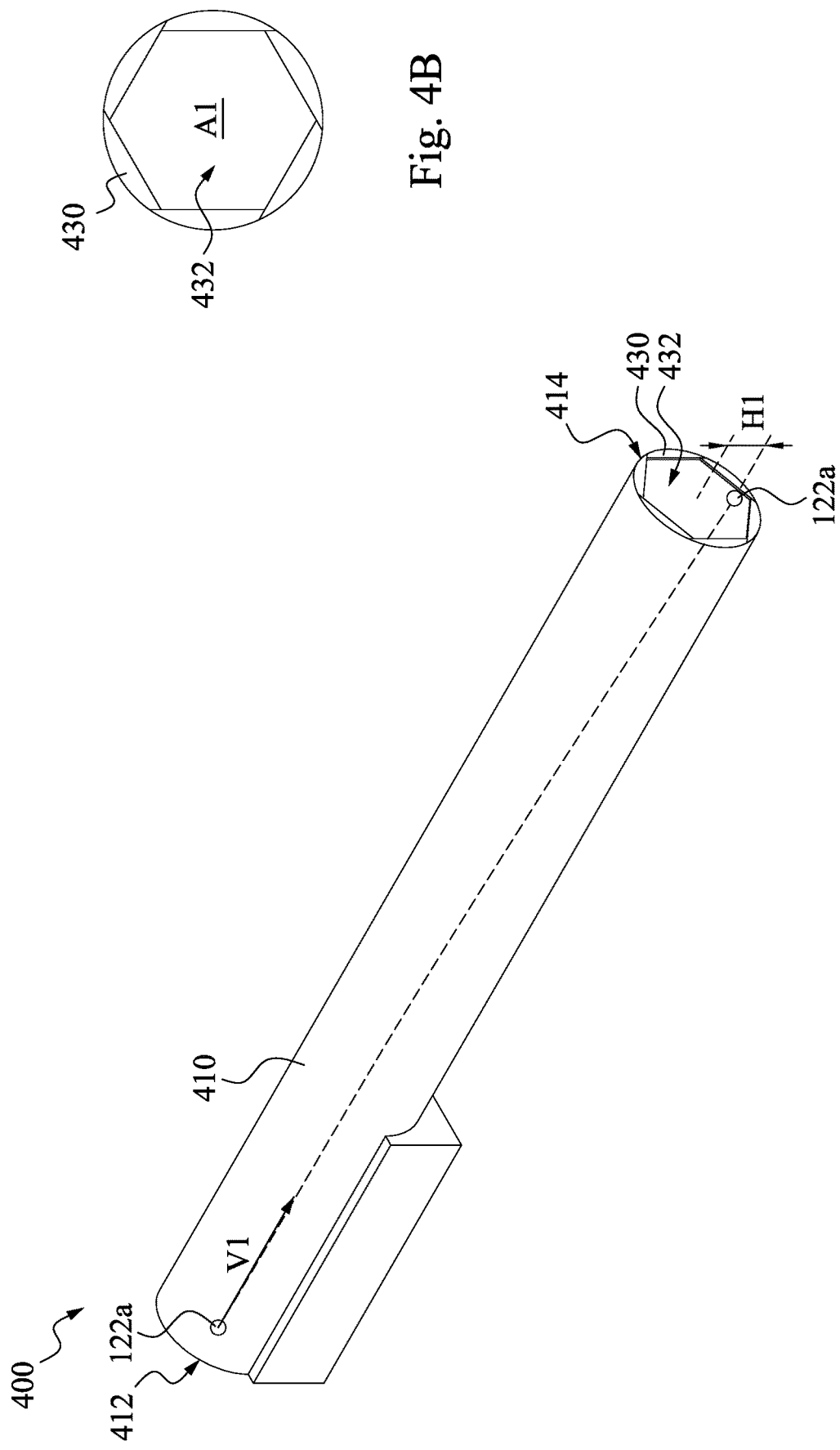

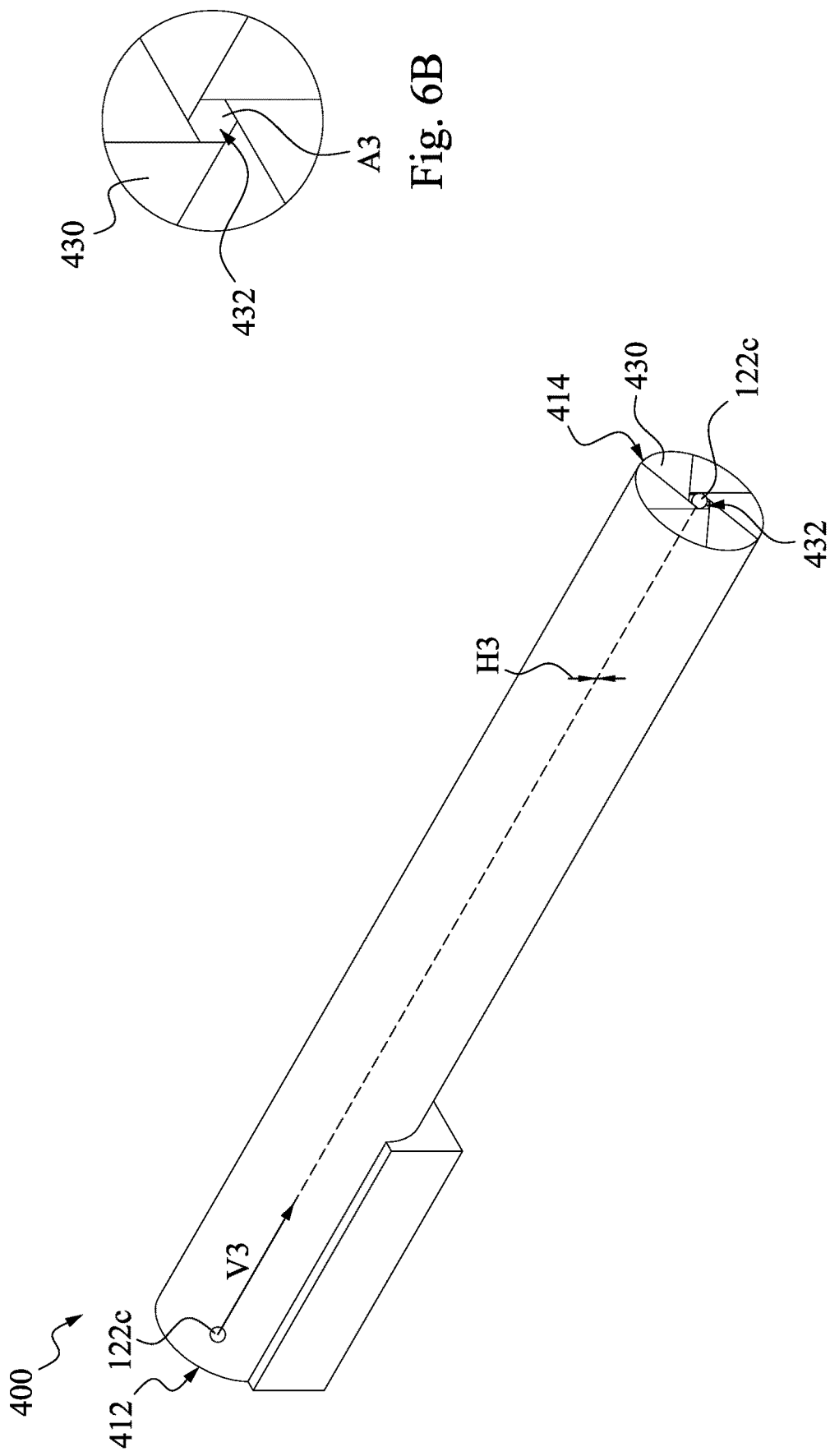

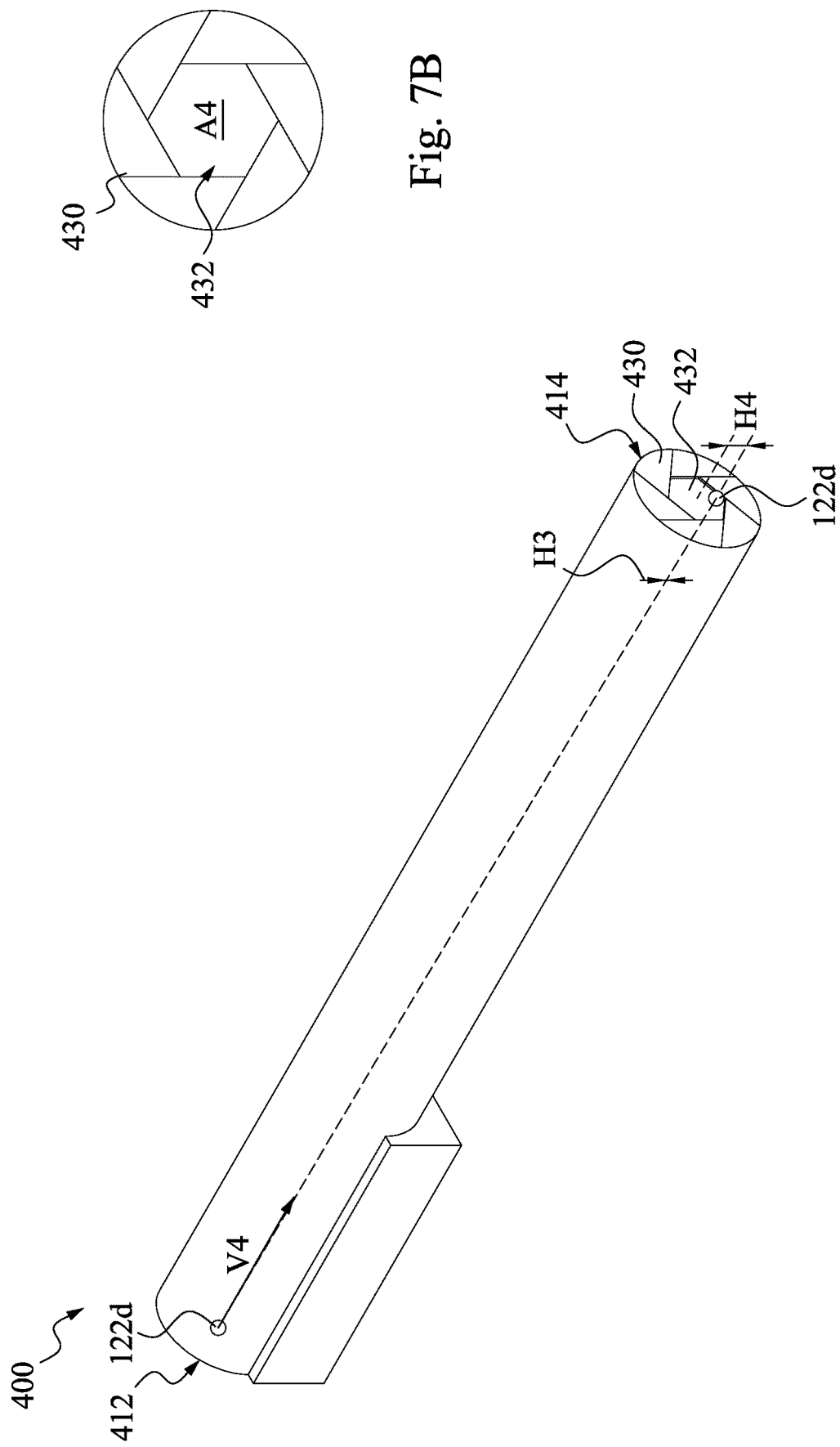

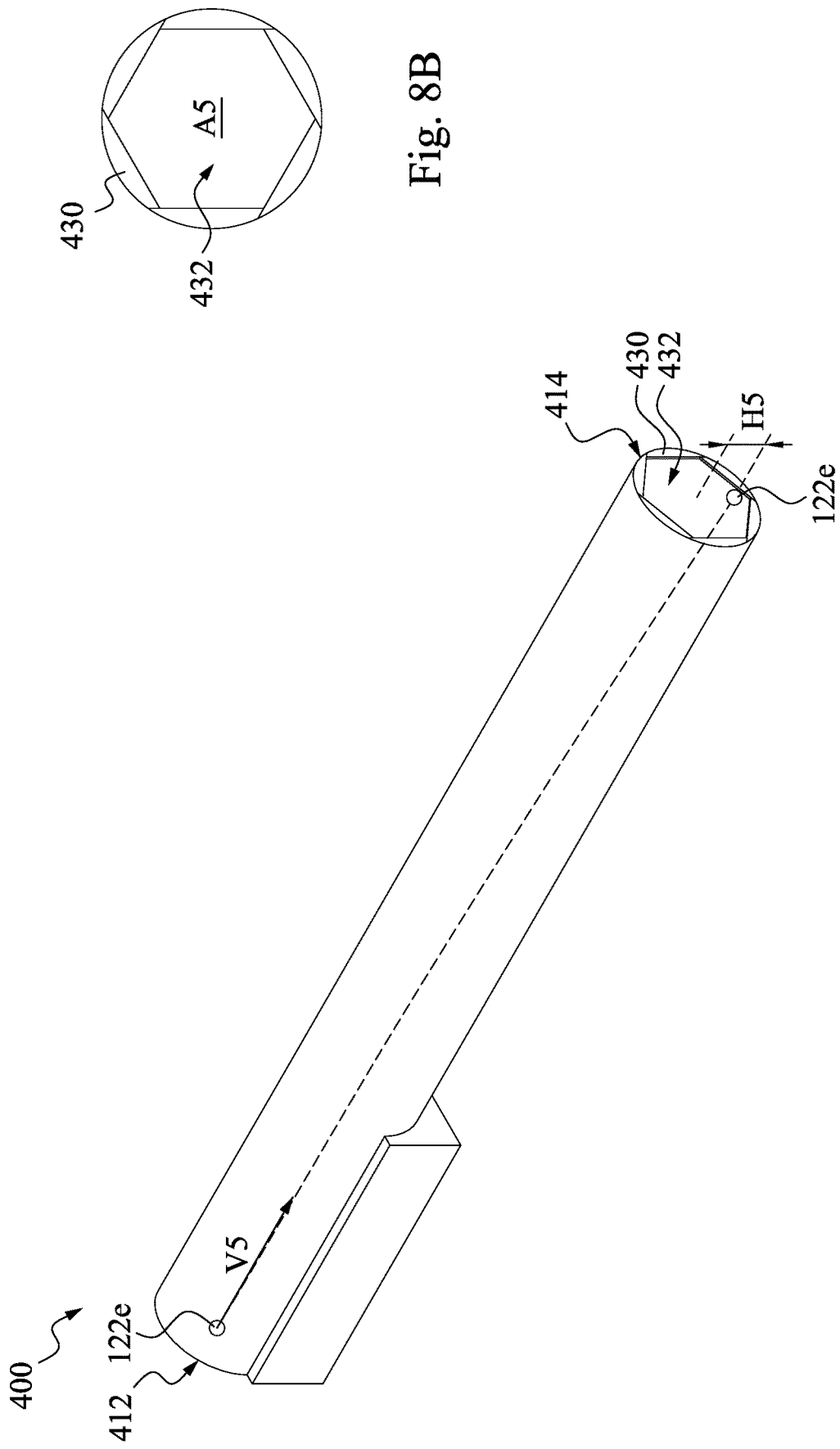

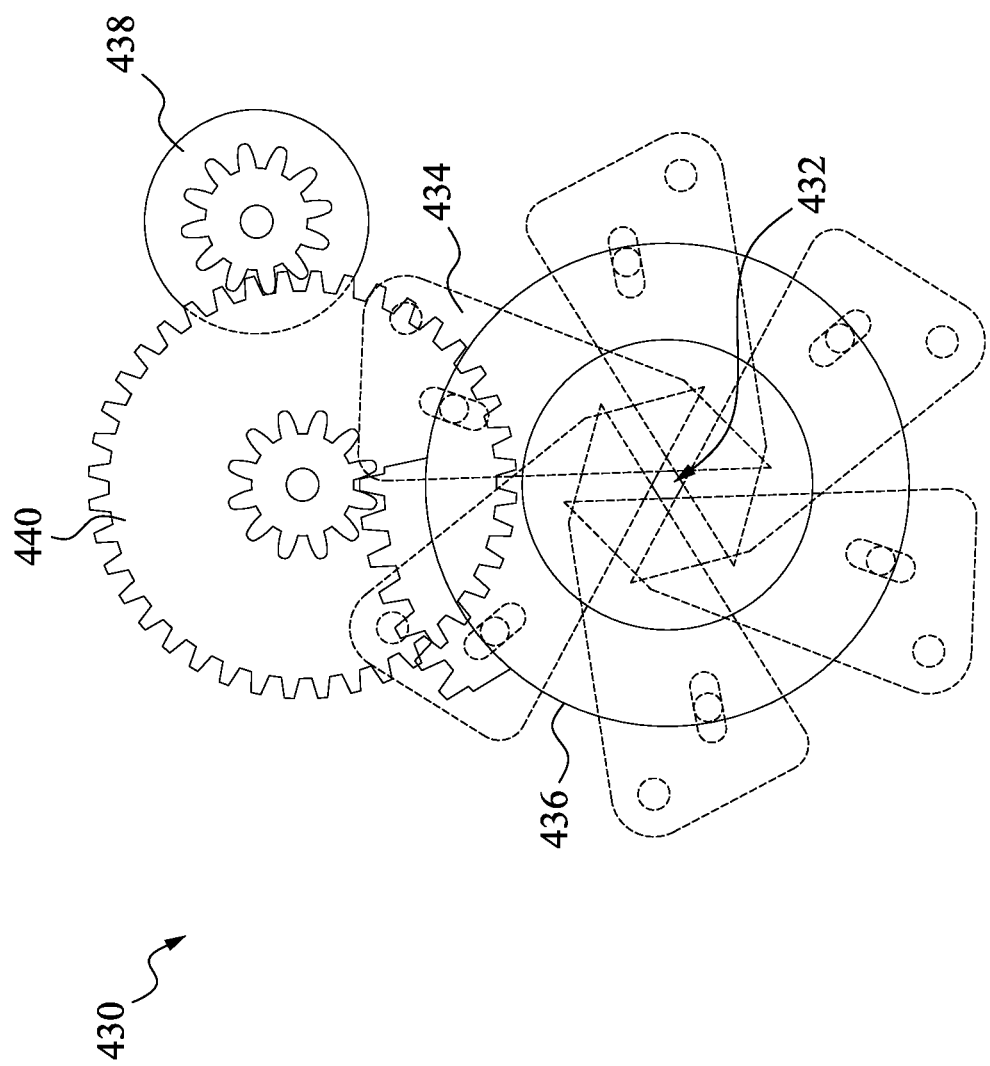

EXTREME ULTRAVIOLET PHOTOLITHOGRAPHY SYSTEM AND METHOD

CROSS-REFERENCE TO RELATED APPLICATION

This application claims priority to U.S. Provisional Application Ser. No. 62/771,564, filed Nov. 26, 2018, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except for that the EUV scanners use reflective rather than refractive optics, i.e., mirrors instead of lenses.

Therefore, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 5A, 6A, 7A, and 8A are oblique views of the shroud at various stages.

FIGS. 4B, 5B, 6B, 7B, and 8B are front views of the shroud at various stages, according to some embodiments of the present disclosure.

FIGS. 9A, 9B, and 9C illustrate an arrangement of the shutter cover, according to some embodiments of the disclosure.

DETAILED DESCRIPTION

Figure 1:
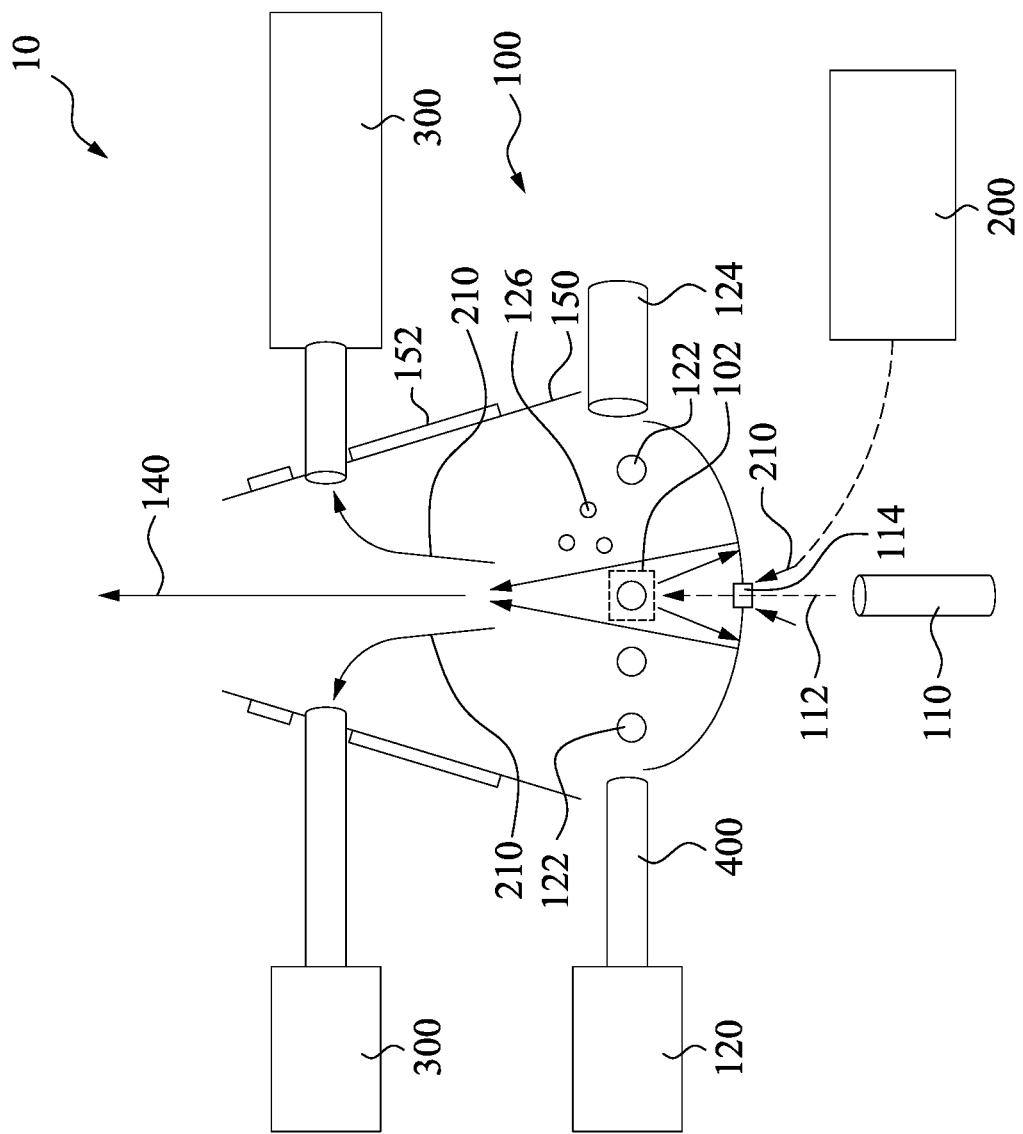
FIG. 1 is a partial view of an EUV lithography system, according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to extreme ultraviolet (EUV) lithography system and methods. More particularly, it is related to apparatus and methods for mitigating contamination on a collector in a laser produced plasma (LPP) EUV radiation source. The collector, also referred to as LPP collector or EUV collector, is an important component of the LPP EUV radiation source. It collects and reflects EUV radiation and contributes to overall EUV conversion efficiency and lithography throughput. However, LPP collector is subjected to damages and degradations due to the impact of particles, ions, radiation, and debris deposition. An object of the present disclosure is directed to reducing debris deposition onto the LPP collector, thereby increasing its usable lifetime.

FIG. 1 is a partial view of an EUV lithography system, according to some embodiments of the disclosure. The EUV system 10 includes a radiation source 100, a gas supply module 200, and at least one exhaust system 300 in a diagrammatical view, in accordance with some embodiments of the disclosure. In some embodiments, the lithography system 10 may include only one exhaust system 300 or more than one exhaust system 300.

The radiation source 100 employs a laser produced plasma (LPP) mechanism to generate plasma and further generate EUV light from the plasma. The radiation source 100 includes a laser source 110, a metallic droplet generator 120, and a LPP collector 130. The laser source 110 may include a carbon dioxide ($CO_2$) laser source, a neodymium-doped yttrium aluminum garnet (Nd:YAG) laser source, or other suitable laser source to generate a laser beam 112. The laser beam 112 is directed through a window 114 integrated with the LPP collector 130. The window 114 adopts a suitable material substantially transparent to the laser beam 112. The metallic droplet generator 120 generates a plurality of metallic droplets 122. In an embodiment, the metallic droplets 122 are tin (Sn) droplets. In some examples, the metallic droplets 122 each may have a diameter about 30 microns (μm) and are generated at a rate about 50 kilohertz (kHz). The metallic droplets 122 are introduced into a zone of excitation in the radiation source 100 at a speed about 70 meters per second (m/s) in one example. Other material may also be used for the metallic droplets 122, for example, a tin-containing liquid material such as eutectic alloy containing tin, lithium (Li), and xenon (Xe).

The laser beam 112 is directed to an excitation region 102 to encounter the metallic droplets 122, such as tin droplets, thereby generating high-temperature plasma, which further produces the EUV light 140. The pulses of the laser source 110 and the droplet generating rate of the droplet generator 120 are controlled to be synchronized such that the metallic droplets 122 receive peak powers consistently from the laser pulses of the laser source 110. In some embodiments, the radiation source 100 may employ a dual LPP mechanism where the laser source 110 is a cluster of multiple laser sources. For example, the laser source 110 may include a pre-heat laser source and a main laser source, which produce pre-heat laser beam and main laser beam, respectively. Each of the pre-heat laser source and the main laser source may be a $CO_2$ laser source, an Nd:YAG laser source, or other suitable laser source. The pre-heat laser beam has a smaller spot size and less intensity than the main laser beam, and is used for pre-heating the metallic droplet 122 to create a low-density target plume, which is subsequently reheated by the main laser beam, generating increased emission of EUV light 140. The EUV light 140 is collected by the collector 130. The collector 130 further reflects and focuses the EUV light 140 for the lithography exposure processes.

The collector 130 is designed with proper coating material and shape, functioning as a mirror for EUV collection, reflection, and focus. In some examples, the collector 130 is designed to have an ellipsoidal geometry. In some examples, the coating material of the collector 130 includes a ML (such as a plurality of Mo/Si film pairs) and may further include a capping layer (such as Ru) coated on the ML to substantially reflect the EUV light. In some examples, the collector 130 may further include a grating structure designed to effectively scatter the laser beam directed onto the collector 130. For example, a silicon nitride layer may be coated on the collector 36 and patterned to have a grating structure.

In some embodiments, the laser beam 112 may or may not hit every metallic droplet 122. For example, some metallic droplets 122 may be purposely missed by the laser beam 112. In the present embodiment, the radiation source 100 includes a droplet catcher 124, which is installed opposite the metallic droplet generator 120 and in the direction of the movement of the metallic droplets 122. The droplet catcher 124 is configured to catch any metallic droplets that are missed by the laser beam 112. Further, the high-temperature plasma may cool down and become vapors or small contaminants (collectively, debris) 126. The debris 126 may deposit onto the surface of the collector 130, thereby causing contamination thereon. Over time, the reflectivity of the collector 130 degrades due to debris accumulation and other factors such as ion damages, oxidation, and blistering.

One mechanism for reducing the aforementioned contamination according to the present disclosure is to integrate a gas flow mechanism with the collector 130. In the present embodiment, the gas flow mechanism includes the gas supply module 200, the exhaust system 300, and various pipelines for integrating the gas flow mechanism with the collector 130. Still referring to FIG. 1, the gas supply module 200 is configured to provide a gas flow 210 into a space proximate the reflective surface of the collector 130. In some embodiments, the gas flow 210 is hydrogen gas, which has less absorption to the EUV radiation. When the metallic droplets 122 contain tin, hydrogen gas flow 210 reaching to the coating surface of the collector 130 (and the window 114 as well) reacts chemically with tin to form stannane ($SnH_4$), a gaseous byproduct of the EUV generation process itself. Pumped out (e.g., by the exhaust system 300), stannane is then discarded. Other suitable gas may be alternatively or additionally used. The gas flow 210 may be introduced into the collector 130 through openings (or gaps) near the window 114 through one or more gas pipelines. In the following discussion, the debris 126 includes such byproducts between the residues of the metallic droplets 122 and the gas flow 210.

The lithography system 10 further includes a cover 150 integrated with the collector 130. Part of the function of the cover 150 is for ventilation and for collecting debris 126. In some embodiments, the cover 150 is made of a suitable solid material, such as stainless steel. The cover 150 is designed and configured around the collector 130 with certain gap between them in the present embodiment. The gap also functions as a gas flow trace for providing the gas flow 210 into the collector 130 and the cover 150. In some embodiments, the lithography system 10 further includes a heating unit 152 configured around part of the cover 150. The heating unit 152 functions to maintain the temperature inside the cover 150 above a melting point of the debris 126 so that the debris 126 does not solidify on the inner surface of the cover 150.

As discussed above, the gas flow 210 also functions to carry the debris 126 out of the collector 130 and the cover 150 and into the exhaust system 300. However, the gas flow can alter the trace of the droplets 122 and impairs their stability. A shroud 400 may help the droplets 122 maintain the intended trace by protecting the droplets 122 from the gas flow. The shroud 400 is disposed in front of the metallic droplet generator 120 and has an end extending above the window 114.

Figure 2:
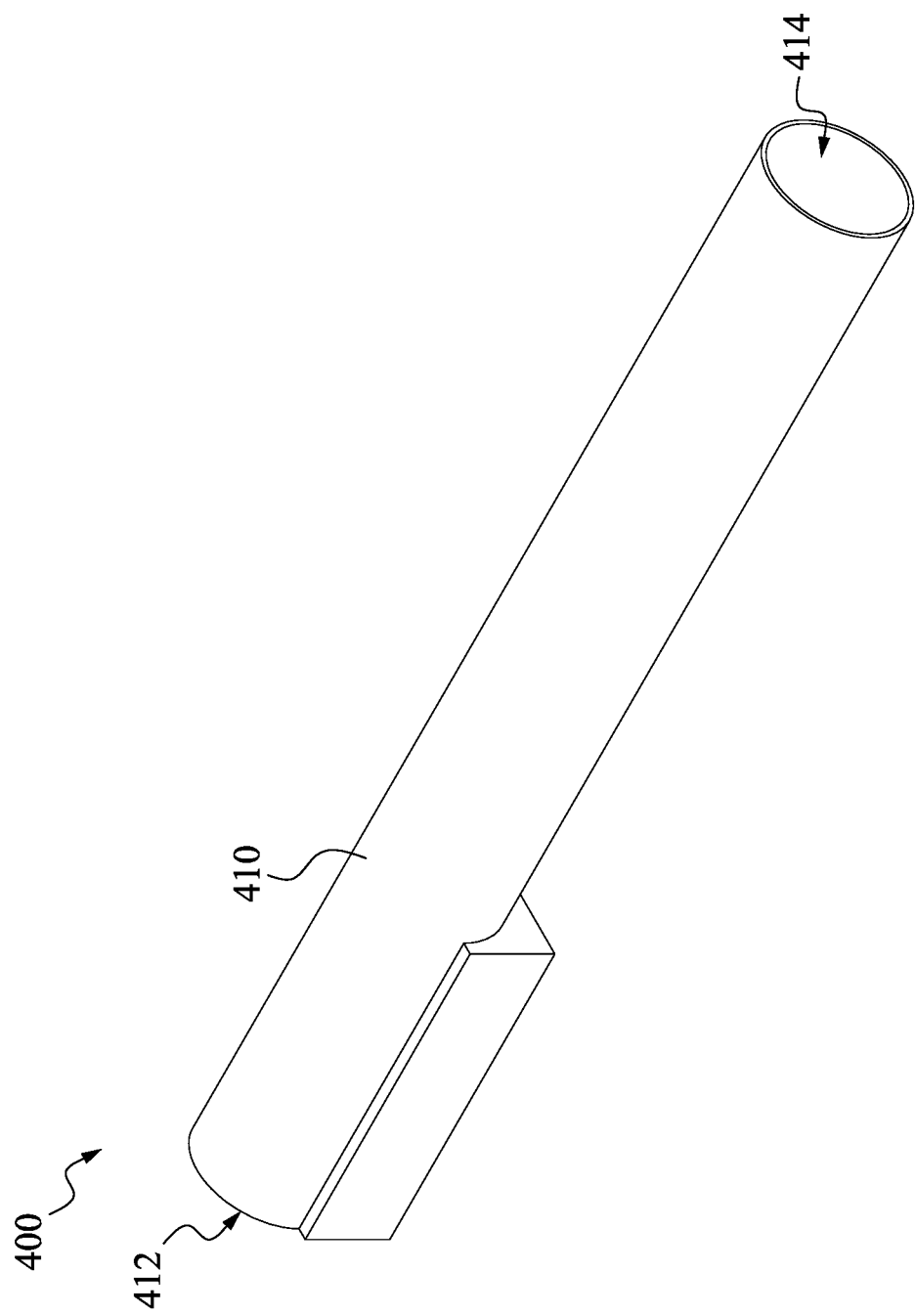
FIG. 2 is an oblique view of the shroud, according to some embodiments of the disclosure.

Reference is made to FIG. 2. FIG. 2 is an oblique view of the shroud 400, according to some embodiments of the disclosure. The shroud 400 can improve the dynamic stability of the droplet position and therefore the EUV dose. In some embodiments, the shroud 400 is in an enclosed configuration, such as a hollow cylinder. The shroud 400 is a solid pipe including a tubular wall 410 formed with a first opening 412 and a second opening 414 on two respective ends of the tubular wall 410. The shroud 400 is configured such that the metallic droplets fed by the droplet generator enter the shroud 400 at the first opening 412, and exits the shroud 400 at the second opening 414.

Referring to FIG. 1 and FIG. 2, the first opening 412 is arranged proximal to and facing the metallic droplet generator 120. The second opening 414 is arranged proximal to and facing the excitation region 102. The tubular wall 410 not only shields the metallic droplets 122 within from being carried upwards by the gas flow 210, such as hydrogen gas flow, but it also shields the metallic droplets 122 from being disturbed sideways by the turbulence of the gas flow 210.

In some embodiments, when the metallic droplets 122 fly to the excitation region 102 and encounters the laser beam 112 to generate the EUV light 140, a shock wave would be generated when the laser beam 112 excites each of the metallic droplets 122 at the excitation region 102. The shock wave thereof would rebound and affect the direction and speed of the following metallic droplet 122. This shock wave creates a pressure that may affect the travel path of the metallic droplets 122 moving toward the excitation region 102, resulting in inaccurately control the effective excitation region 102. In order to prevent the situation that the shock wave rebounds and affect the trace of the metallic droplets 122, the shroud 400 further includes a cover disposed at the second opening 414 of the shroud 400.

Figure 3:
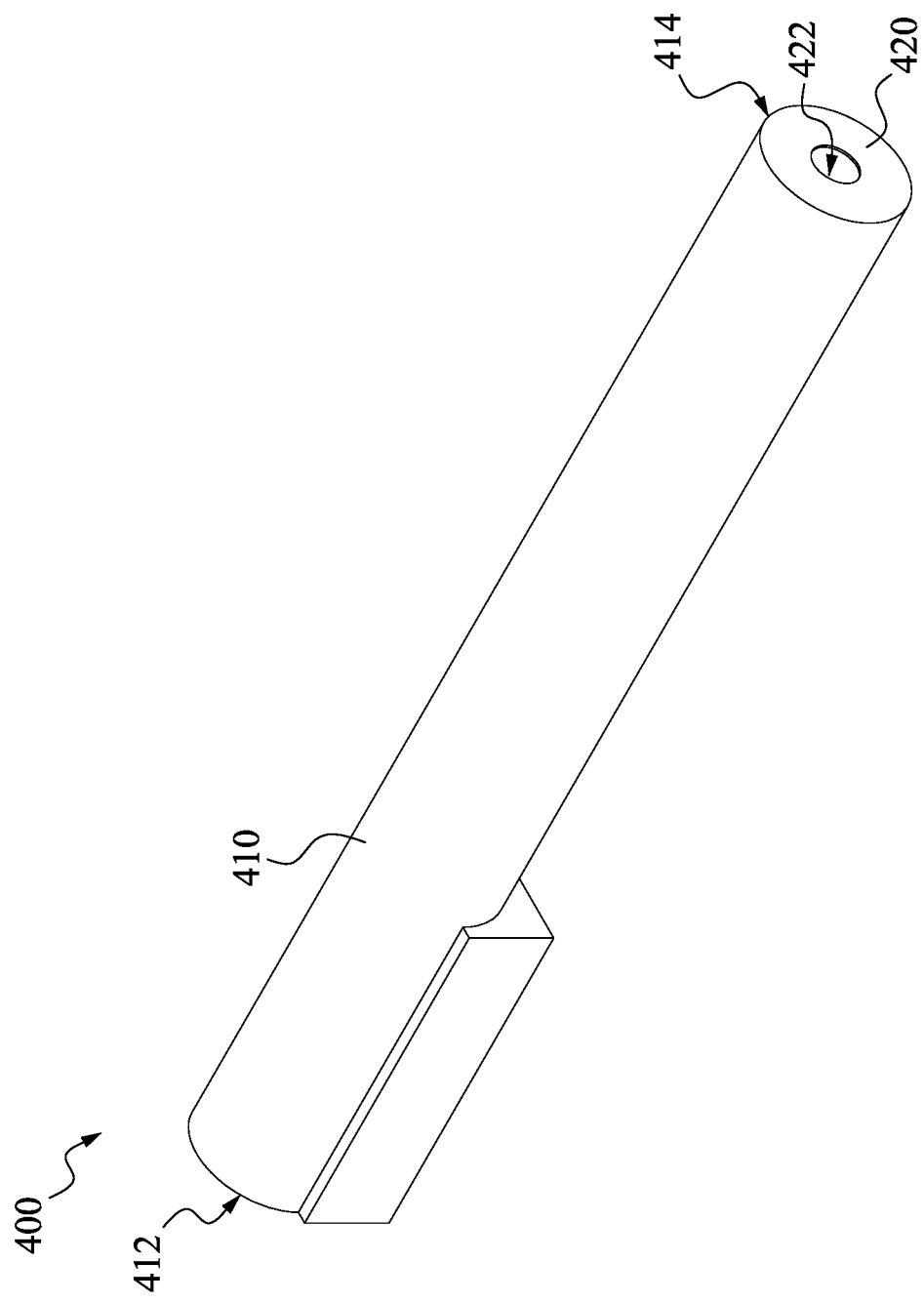
FIG. 3 is an oblique view of the shroud having the cover, according to some embodiments of the present disclosure.

FIG. 3 is an oblique view of the shroud 400 having the cover 420, according to some embodiments of the present disclosure. The cover 420 is arranged at the second opening 414 of the shroud 400 facing the excitation region and has an aperture 422. The cover 420 can shield the region inside the shroud 400 from pressure waves outside the shroud 400, and thereby reduce the effect of the shock wave on the travel path of the metallic droplets inside the shroud 400.

The diameter of the aperture 422 of the second opening 414 is at least greater than a diameter of the metallic droplets 122 (see FIG. 1) to allow the metallic droplet 122 passing through but cannot be too big, otherwise the function of shielding the region inside the shroud 400 from the pressure wave caused by the shock wave would be reduced. However, due to the effects of gravity, the trace of the metallic droplet 122 may have a downward displacement, from the first opening 412 to the second opening 414. The longer the metallic droplet 122 travels inside the shroud, the greater the downward displacement of the metallic droplet 122 when it exits the second opening 414 of the shroud 400. Therefore, if the metallic droplet 122 is fed by the droplet generator 120 (see FIG. 1) to the first opening 412 of the shroud 400 at a greater velocity, then the amount of time the metallic droplet 122 travels inside the shroud 400 is smaller, and the vertical displacement of the metallic droplet 122 at the second opening 414 is smaller. In other words, when the metallic droplet 122 is fed to the first opening 412 of the shroud 400 at a greater velocity, the metallic droplet 122 exits the second opening 414 of the shroud at a greater height.

In some embodiments, the metallic droplet generator 120 requires a warm up period to speed up the metallic droplets 122 to a predetermined stable velocity. Therefore, the velocity of each of the metallic droplet 122 varies during the warm up period of the metallic droplet generator 120, and that makes the design of the diameter of the aperture 422 of the second opening 414 of the shroud 400 more complicated.

Reference is made to FIGS. 4A, 4B, 5A, 5B, 6A, 6B, 7A, 7B, 8A, and 8B in which FIGS. 4A, 5A, 6A, 7A, and 8A are oblique views of the shroud 400 at various stages, and FIGS. 4B, 5B, 6B, 7B, and 8B are front views of the shroud 400 at various stages, according to some embodiments of the present disclosure. In some embodiments, the droplet generator feeds the metallic droplets 122 to the first opening 412 of the shroud 400 at different velocities, due to the lower velocities of the metallic droplets during starting up and shutting down of the droplet generator. During operation, the laser requires target at a position on the travel path of the metallic droplets 122 at the excitation region. In order to accurately target the metallic droplets 122 at the excitation region, the flight path of the metallic droplets 122 are kept stable, which is done by keeping the velocities of the metallic droplets 122 entering the first opening 412 of the shroud 400 at a constant operation velocity.

Referring to FIG. 4A and FIG. 4B, when the droplet generator is started from rest before operation, metallic droplets 122a are fed to the first opening 412 of the shroud 400 at a first velocity V1, which is lower than the operation velocity. At this state, the shutter cover 430 of the shroud 400 at the second opening 414 is almost completely open, such that the aperture 432 of the shutter cover 430 has an open area A1, which is almost equal to the size of the second opening 414. Due to the effects of gravity, the travel path of the metallic droplets 122a fed to the first opening 412 of the shroud 400 at the first velocity V1 has a first downward displacement H1, when the metallic droplets 122a exit the second opening 414 of the shroud 400. The open area A1 of the aperture 432 of the shutter cover 430 is sufficient great enough to allow the metallic droplets 122a, having the first downward displacement H1, passing through. At this state, the metallic droplets 122a may not encounter the laser beam, due to the first downward displacement H1. Therefore, the metallic droplets 122a do not participate in effective EUV light emitting.

Figures 5A, 5B:
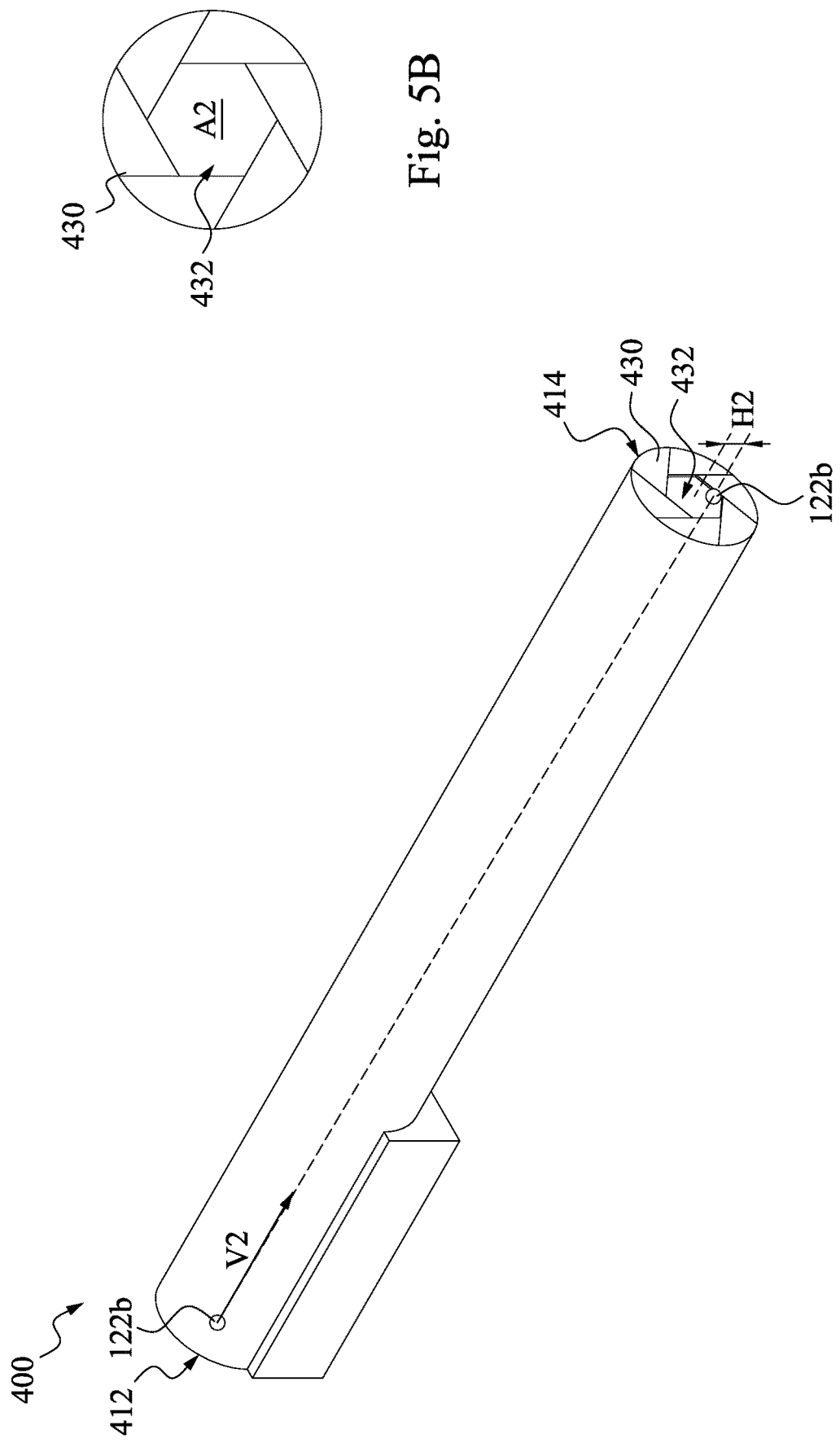

Referring to FIG. 5A and FIG. 5B, when the droplet generator is operated and warms up, metallic droplets 122b are fed to the first opening 412 of the shroud 400 at a second velocity V2, which is greater than the first velocity V1 but is still lower than the operation velocity. At this state, the shutter cover 430 of the shroud 400 at the second opening 414 is adjusted, such that the aperture 432 of the shutter cover 430 has an open area A2, which is smaller than the open area A1. Because the droplet generator is still at the warm up stage, the travel path of the metallic droplets 122b fed to the first opening 412 of the shroud 400 at the second velocity V2 is still affected by gravity and has a second downward displacement H2, when the metallic droplets 122b exit the second opening 414 of the shroud 400. The open area A2 of the aperture 432 of the shutter cover 430 is sufficient great enough to allow the metallic droplets 122b, having the second downward displacement H2, passing through, such that the path of the metallic droplets 122b exiting the shroud 400 is not impeded. At this state, the metallic droplets 122b may or may not encounter the laser beam. However, the metallic droplets 122b do not participate in effective EUV light emitting at this stage.

Referring to FIG. 6A and FIG. 6B, when the droplet generator fully warms up and works at the operation state, metallic droplets 122c are fed to the first opening 412 of the shroud 400 at a third velocity V3, which is much greater than the first velocity V1 and the second velocity V2. The third velocity V3 can be regarded as the operation velocity. Once the velocity of the metallic droplets 122c entering the first opening 412 reaches the operation velocity, the velocity stabilizes and remains constant, such that the travel path of the metallic droplets 122c remains constant so the laser beam can precisely target the metallic droplets at a position in the excitation region to generate EUV light.

After the metallic droplets 122c achieve a stable operation velocity, the metallic droplets 122c exit the second opening 414 closer to the center of the second opening 414. The shutter cover 430 moves to cover a peripheral portion of the second opening 414 of the shroud 400, so as to shield the metallic droplets 122c travelling inside the shroud 400 from shock waves generated at the excitation region. The shutter cover 430 of the shroud 400 at the second opening 414 is adjusted, such that the aperture 432 of the shutter cover 430 has an open area A3, which is smaller than the open area A2. Because the third velocity V3 of the metallic droplets 122c is really high, the travel path of the metallic droplets 122c fed to the first opening 412 of the shroud 400 at the third velocity V3 is free from suffering by gravity and has a third downward displacement H3, when the metallic droplets 122c exit the second opening 414 of the shroud 400. At the operation state, the velocity of each metallic droplet fed into the shroud 400 is fixed and equals to the third velocity V3, such that the travel path of each metallic droplet 122c is simulate and has the third downward displacement H3. The amount of the third downward displacement H3 is very small and is stable during the operation state.

The open area A3 of the aperture 432 of the shutter cover 430 is sufficient great enough to allow the metallic droplets 122c, having the second downward displacement H3, passing through. The shutter cover 430 covers large portion of the second opening 414 of the shroud 400. The shutter cover 430 shields the shock waves which are generated when the laser beam excites each metallic droplet 122c. The shock waves thereof would be blocked by the shutter cover 430 and would not affect the direction and speed of the following metallic droplet 122c nor the travel path of the metallic droplet moving to the excitation region. As a result, the excitation region can be controlled accurately. If the open area A3 of the aperture 432 of the shutter cover 430 is too big, the shielding ability of the shutter cover 430 is insufficient to block the shock wave. If the open area A3 of the aperture 432 of the shutter cover 430 is too small, the metallic droplet may not pass through the aperture 432 of the shutter cover 430.

Referring to FIG. 7A and FIG. 7B, when the droplet generator is in the process of shutting down, metallic droplet 122d are also fed to the first opening 412 of the shroud 400 at a fourth velocity V4 lower than the operation velocity. Because the fourth velocity V4 of feeding the metallic droplets 122d is slower than the operation velocity, the travel path of the metallic droplets 122d fed to the first opening 412 of the shroud 400 at the fourth velocity V4 is affected by gravity and has a fourth downward displacement H4, when the metallic droplets 122d exit the second opening 414 of the shroud 400. As the droplet generator shuts down, the shutter cover 430 moves to preemptively uncover a peripheral portion of the second opening 414 of the shroud 400, so as to allow the metallic droplets 122d to exit the second opening 414. The aperture 432 of the shutter cover 430 has an open area A4, and the open area A4 of the aperture 432 of the shutter cover 430 is sufficient great enough to allow the metallic droplets 122d, having the fourth downward displacement H4, passing through, such that the path of the metallic droplets 122d exiting the shroud 400 is not impeded. At this state, the metallic droplets 122d may or may not encounter the laser beam. The metallic droplets 122d do not participate in effective EUV light emitting at this stage.

Referring to FIG. 8A and FIG. 8B, the velocity of the metallic droplets 122e further decreases, and the metallic droplets 122e begin to exit the second opening 414 of the shroud 400 at decreasing heights. At this state, the shutter cover 430 of the shroud 400 at the second opening 414 is almost completely open, such that the aperture 432 of the shutter cover 430 has an open area A5, which is almost equal to the size of the second opening 414.

Figure 9A:
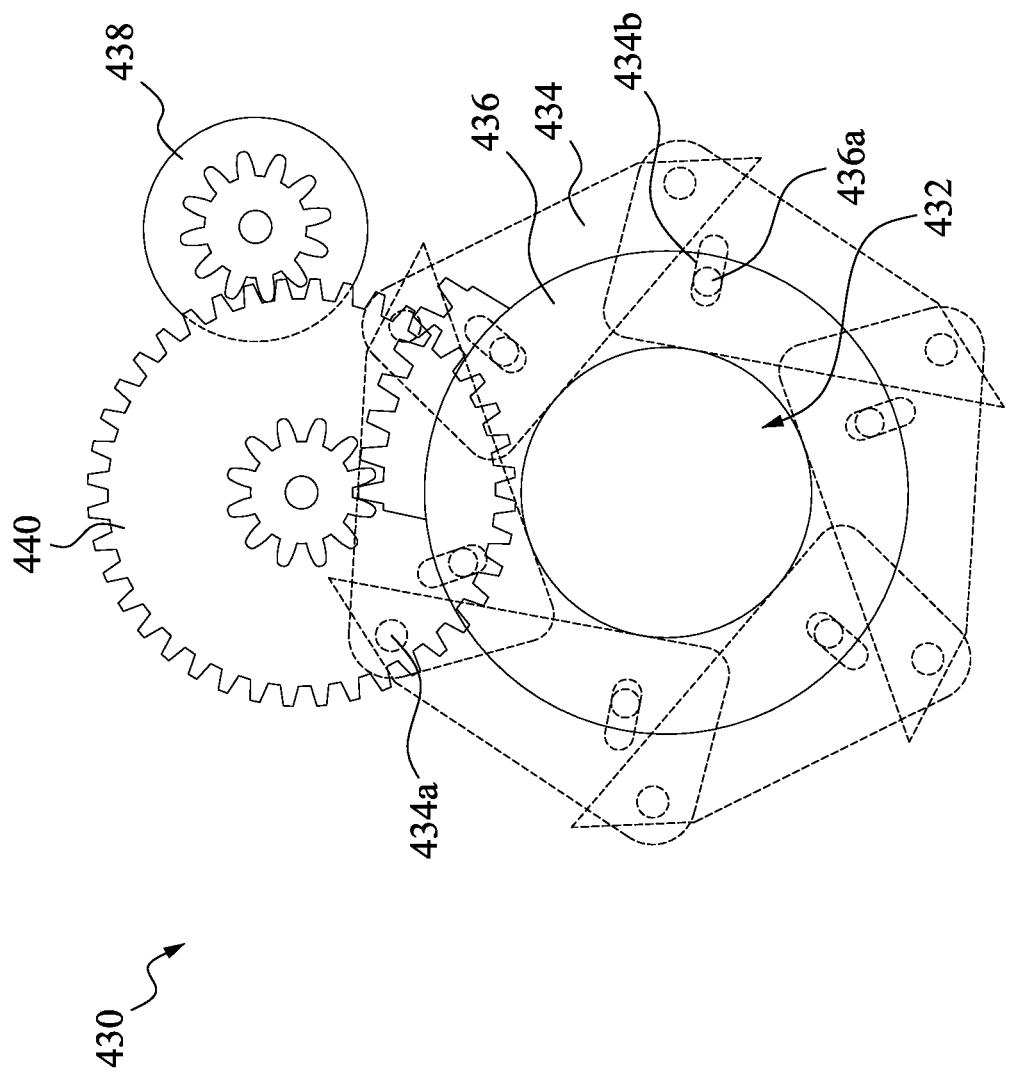
Figure 9B:
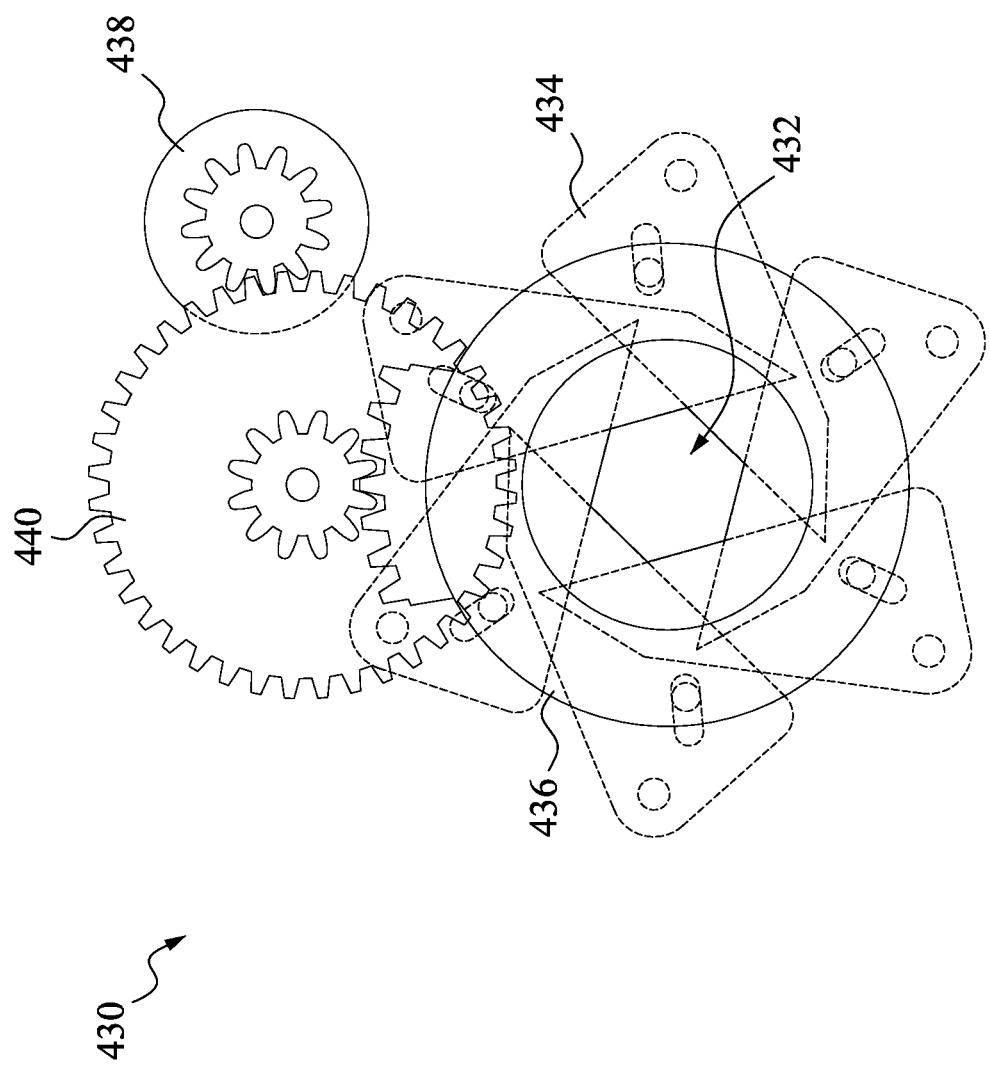

FIGS. 9A, 9B, and 9C illustrate an arrangement of the shutter cover 430, according to some embodiments of the disclosure. The shutter cover 430 is disposed at the second opening of the shroud. The shutter cover 430 includes a plurality of shutter blades 434 arranged at regular intervals around the second opening. The shutter blades 434 can be control to close to or away from a center of the second opening, such that the open area of the aperture 432 of the shutter cover 430 can be varied at different stages.

In some embodiments, the shutter cover 430 includes shutter blades 434, a sector gear 436 engaged with the shutter blades 434 for acting as a member of the shutter blades actuator, a stepping motor 438, and a reduction gear 440. Also, the stepping motor 438 would receive a control signal from the microcomputer when the aperture 432 becomes the desired size. Although there are three shutter blades 434 illustrated in FIGS. 9A-9C, the number of the shutter blades 434 is not limited to.

FIG. 9A shows that the shutter cover 430 is fully opened, in which the open area of the aperture 432 is almost equals to the second opening of the shroud. The aperture 432 of the shutter cover 430 shown in FIG. 9A is corresponding to the shup down state of the droplet generator or the beginning of the warm up state of the droplet generator.

In operation, the stepping motor 438 starts rotating counterclockwise, for example from its shutter open position shown in FIG. 9A. Then, the reduction gear 440 turns clockwise causing the sector gear 436 to rotate counterclockwise. Each of the shutter blades 434 has a pivot pin 434a thereof mounted to a base, not shown, for pivotal movement of the shutter blades 434. Each shutter blades 434 has a slot 434b arranged therein for accepting a pin 436a of the sector gear 436. Hence, as the sector gear 436 rotates, the shutter blades 434 turn in a counter direction thus the shutter blades 434 are moved close to the center of the aperture 432. The stepping motor 438 is controllable and is stopped when the aperture 432 becomes a desired size, as shown in FIG. 9B, in which the aperture 432 shown in FIG. 9B is corresponding to the warm up state of the droplet generator.

In FIG. 9C, the stepping motor 438 continues rotating counterclockwise. The reduction gear 440 turns clockwise causing the sector gear 436 to rotate counterclockwise. Thus, the shutter blades 434 are moved closer to the center of the aperture 432. The stepping motor 438 is stopped when the aperture 432 becomes a desired size, as shown in FIG. 9C, in which the aperture 432 shown in FIG. 9C is corresponding to the operation state of the droplet generator.

The mechanism discussed in FIG. 9A through FIG. 9C is an exemplary embodiment of the shutter cover 430. The purpose of the adjusting the size of the aperture of the shutter cover 430 can be achieved by any suitable mechanism design and should not be limited to the mechanism as discussed above.

Figure 10:
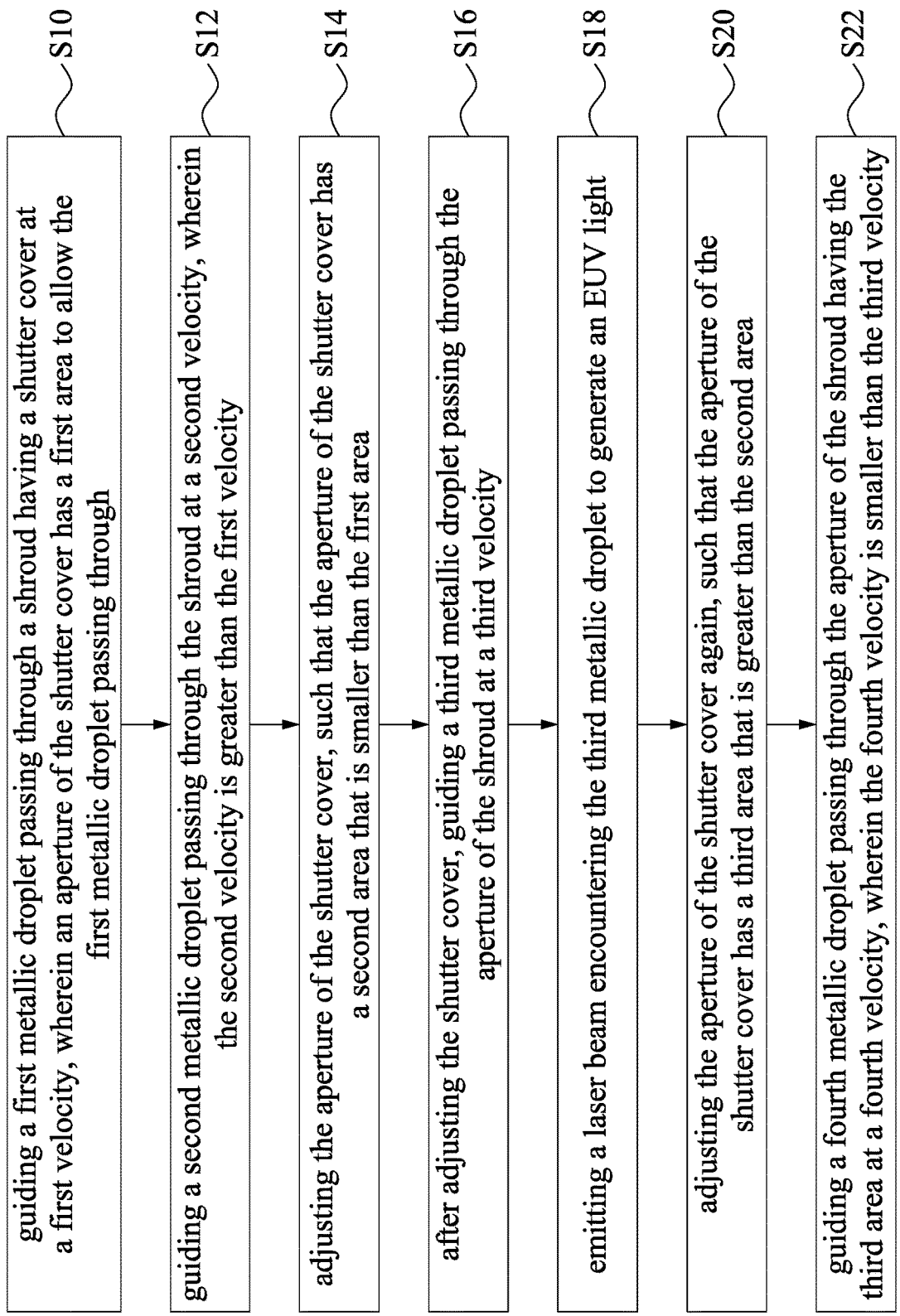
FIG. 10 is a flowchart of a method of operating the lithography system, according to some embodiments of the disclosure.

Reference is made to FIG. 10, which is a flowchart of a method of operating the lithography system, according to some embodiments of the disclosure. The method begins at step S10, in which a first metallic droplet is guided to pass through a shroud having a shutter cover at a first velocity. At step S10, a droplet generator is at the warm up stage, and the travel path of the first metallic droplet has a large downward displacement. Therefore, the aperture of the shutter cover has greater area to allow the first metallic droplet passing through.

In step S12, metallic droplets fed by the droplet generator are speed up, and a second metallic droplet is guided and passes through the shroud at a second velocity, in which the second velocity is greater than the first velocity. In some embodiments, the second velocity is lower than the operating velocity of the droplet generator and does not participate in generating EUV light. In some other embodiments, the second velocity is substantially equal to the operating velocity of the droplet generator, and the second metallic droplet participates in generating EUV light, which will be described in step S18.

In step S14, when the velocity of the metallic droplets fed by the droplet generator becomes stable and consistent, the aperture of the shutter cover is adjusted, such that the aperture of the shutter cover has a second area that is smaller than the first area. The second area of the aperture of the shutter cover is sufficient great enough to allow the metallic droplet passing through. In some embodiments, the shroud is an enclosed shroud having a first opening and a second opening, and the shutter cover is disposed at the second opening. The shutter cover includes shutter blades. The area of the aperture of the shutter cover is adjusted by moving the shutter blades of the shutter cover.

In step S16, a third metallic droplet is guided and passes through the shroud at a third velocity, in which the third velocity is the operating velocity of the droplet generator. Because the third velocity is greater than the first velocity, the travel path of the third metallic droplet is closer to a center of the aperture than that of the first metallic droplet.

In step S18, a laser beam is emitted from a laser source and encounters the third metallic droplet to generate the EUV light. In some embodiments, the laser beam also encounters the second metallic droplet to generate the EUV light as well.

In step S20, the droplet generator is going to shut down and metallic droplets fed by the droplet generator would be slow down. The aperture of the shutter cover is adjusted again, such that the aperture of the shutter cover has a third area that is greater than the second area.

In step S22, a fourth metallic droplet is guided and passes through the aperture of the shroud having the third area at a fourth velocity, in which the fourth velocity is smaller than the operation velocity. The third area of the aperture of the shutter cover is great enough to allow the fourth metallic droplet, having the slower velocity passing through.

Figure 11:
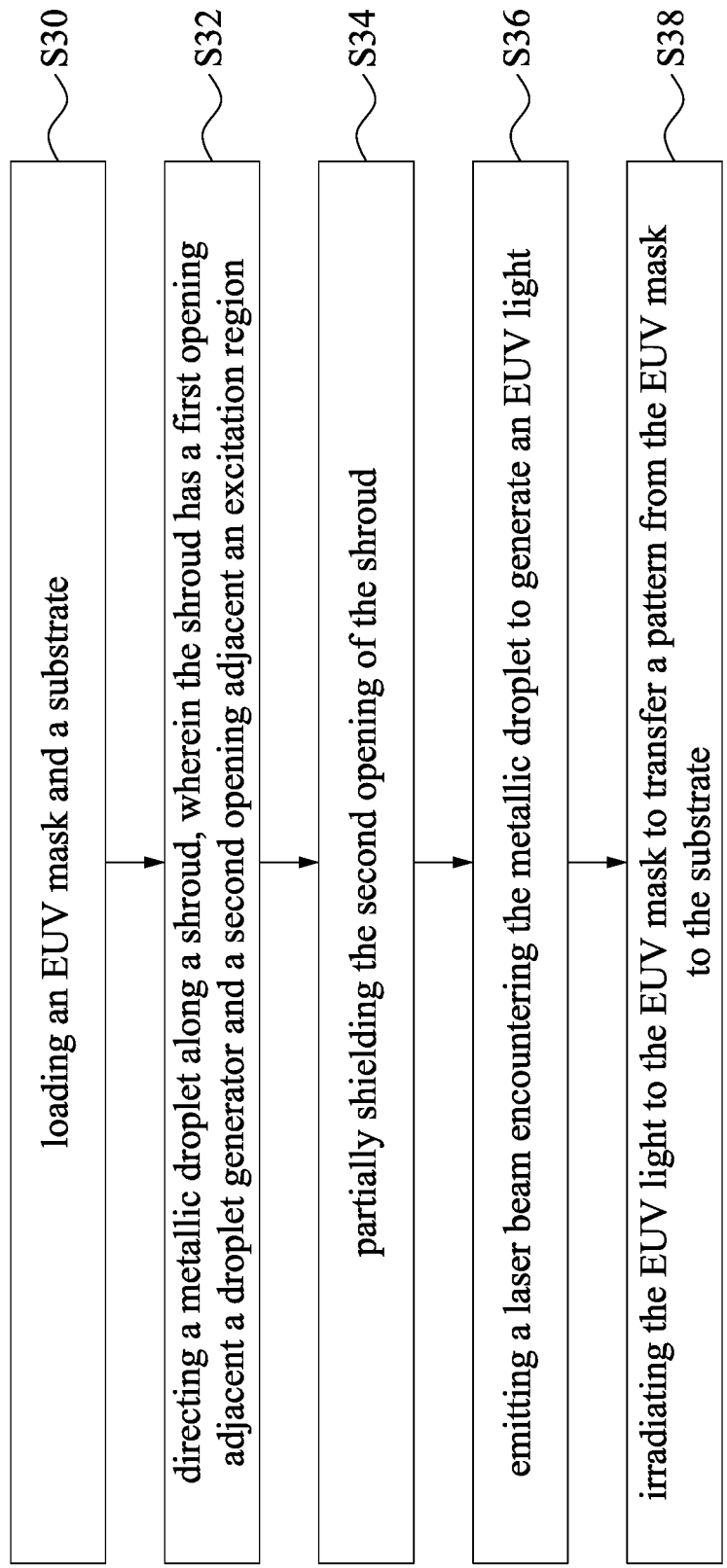
FIG. 11 is a flowchart of a method of operating an EUV lithography system, according to some embodiments of the disclosure.

Reference is made to FIG. 11, which is a flowchart of a method of operating an EUV lithography system, according to some embodiments of the disclosure. In step S30, an EUV mask and a substrate are loaded in a chamber.

In step S32, a metallic droplet is directed along a shroud, in which the shroud has a first opening adjacent a droplet generator and a second opening adjacent an excitation region. In some embodiments, the travel path of the metallic droplet is collimated and stable.

In step S34, the second opening of the shroud is partially shielded. In some embodiments, a shutter cover is assembled at the second opening to block the shock wave. In some embodiments, a size of an aperture of the shutter cover can be varied by for example, moving shutter blades of the shutter cover.

In step S36, a laser beam is emitted to encounter the metallic droplet to generate an EUV light. In some embodiments, a shock wave is generated when the laser beam encounters the metallic droplet, at the excitation region. The second opening is partially shielded to prevent the travel path of the metallic droplet from being affected by the shock wave. For example, the shock wave can be blocked by the shutter cover. In some embodiments, the method further includes providing a gas to the excitation region to carry out contaminates from the metallic droplet. The gas can be hydrogen gas.

In step S38, the EUV light is irradiated to the EUV mask to transfer a pattern of the EUV mask to the substrate.

The EUV system provides a shutter cover disposed at an opening of a shroud. The shutter cover has a variable opening to allow metallic droplets passing through and shields the shock waves which are generated when the laser beam excites each metallic droplet as well. The variable opening can enlarged during a warm up stage of a droplet generator.

According to some embodiments of the disclosure, A method of operating an extreme ultraviolet (EUV) lithography system includes guiding a first metallic droplet passing through a shroud having a shutter cover at a first velocity, wherein an aperture of the shutter cover has a first area to allow the first metallic droplet passing through. A second metallic droplet is guided passing through the shroud at a second velocity, wherein the second velocity is greater than the first velocity. The aperture of the shutter cover is adjusted, such that the aperture of the shutter cover has a second area that is smaller than the first area. After adjusting the shutter cover, a third metallic droplet is guided passing through the aperture of the shroud at a third velocity. A laser beam is emitted and encounters the third metallic droplet to generate an EUV light.

According to some embodiments of the disclosure, a method of operating an extreme ultraviolet (EUV) lithography system includes directing a metallic droplet along a shroud, wherein the shroud has a first opening adjacent a droplet generator and a second opening adjacent an excitation region; partially shielding the second opening of the shroud; and emitting a laser beam encountering the metallic droplet to generate an EUV light.

According to some embodiments of the disclosure, an EUV lithography system includes a laser source, a droplet generator configured to generate metallic droplets, a shroud having a first opening adjacent the droplet generator and a second opening above the laser source, and a shutter cover disposed at the second opening of the shroud.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating an extreme ultraviolet (EUV) lithography system, the method comprising:
    guiding a first metallic droplet passing through a shroud having a shutter cover at a first velocity, wherein an aperture of the shutter cover has a first area to allow the first metallic droplet passing through;
    guiding a second metallic droplet passing through the shroud at a second velocity, wherein the second velocity is greater than the first velocity;
    adjusting the aperture of the shutter cover, such that the aperture of the shutter cover has a second area that is smaller than the first area;
    after adjusting the shutter cover, guiding a third metallic droplet passing through the aperture of the shroud at a third velocity; and
    emitting a laser beam encountering the third metallic droplet to generate an EUV light.

2. The method of claim 1, wherein a travel path of the third metallic droplet is closer to a center of the aperture than that of the first metallic droplet.

3. The method of claim 1, wherein the third velocity is greater than the second velocity.

4. The method of claim 1, wherein the third velocity is equals to the second velocity, and the laser beam encounters the second metallic droplet.

5. The method of claim 1, wherein the shroud is an enclosed shroud having a first opening and a second opening, and the shutter cover is disposed at the second opening.

6. The method of claim 1, wherein adjusting the aperture of the shutter cover is performed by moving shutter blades of the shutter cover.

7. The method of claim 1, further comprising:
adjusting the aperture of the shutter cover again, such that the aperture of the shutter cover has a third area that is greater than the second area; and
guiding a fourth metallic droplet passing through the aperture of the shroud having the third area at a fourth velocity, wherein the fourth velocity is smaller than the third velocity.

8. A method of operating an extreme ultraviolet (EUV) lithography system, the method comprising:
ejecting a metallic droplet to move along a shroud, wherein the shroud has a first opening adjacent a droplet generator and a second opening adjacent an excitation region;
decreasing an area of the second opening of the shroud after ejecting the first metallic droplet; and
illuminating the first metallic droplet with a laser beam to generate EUV light; and
ejecting a second metallic droplet to move along the shroud after decreasing the area of the second opening of the shroud, wherein a velocity of the second metallic droplet is greater than a velocity of the first metallic droplet.

9. The method of claim 8, wherein a shock wave is generated when the laser beam encounters the first metallic droplet.

10. The method of claim 9, further comprising assembling a shutter cover at the second opening to block the shock wave.

11. The method of claim 10, wherein decreasing an area of the second opening of the shroud comprises decreasing a size of an aperture of the shutter cover.

12. The method of claim 11, wherein decreasing the size of the aperture of the shutter cover comprises moving shutter blades of the shutter cover.

13. The method of claim 8, further comprising:
providing a gas to the excitation region to carry out contaminates from the first metallic droplet.

14. The method of claim 8, further comprising:
loading an EUV mask and a substrate; and
irradiating the EUV light to the EUV mask to transfer a pattern from the EUV mask to the substrate.

15. The method of claim 8, wherein the first metallic droplet comprises tin.

16. An extreme ultraviolet (EUV) lithography system, comprising:
a laser source;
a droplet generator configured to generate metallic droplets;
a shroud having a first end opening adjacent the droplet generator and a second end opening above the laser source; and
a shutter cover disposed at the second end opening of the shroud, wherein the shutter cover and the laser source are separated by a space, and the shroud is absent from the space.

17. The system of claim 16, wherein the shroud is a solid pipe.

18. The system of claim 16, wherein the shutter cover comprises a variable aperture to partially shield the second end opening.

19. The system of claim 18, wherein the shutter cover comprises a plurality of shutter blades and a driving component configured to move the shutter blades.

20. The system of claim 16, further comprising a gas supply module configured to provide a gas flow comprising hydrogen into a chamber.

* * * * *